United States Patent
Masuda et al.

(10) Patent No.: US 11,067,875 B2
(45) Date of Patent: Jul. 20, 2021

(54) STEREO CAMERA DEVICE

(71) Applicant: Hitachi Automotive Systems, Ltd., Hitachinaka (JP)

(72) Inventors: Keisuke Masuda, Hitachinaka (JP); Yoshiyuki Sasada, Hitachinaka (JP)

(73) Assignee: Hitachi Automotive Systems, Ltd., Hitachinaka (JP)

( * ) Notice: Subject to any disclaimer, the term of this patent is extended or adjusted under 35 U.S.C. 154(b) by 0 days.

(21) Appl. No.: 16/969,636

(22) PCT Filed: Mar. 6, 2019

(86) PCT No.: PCT/JP2019/008757
§ 371 (c)(1),
(2) Date: Aug. 13, 2020

(87) PCT Pub. No.: WO2019/176669
PCT Pub. Date: Sep. 19, 2019

(65) Prior Publication Data
US 2020/0401020 A1    Dec. 24, 2020

(30) Foreign Application Priority Data

Mar. 15, 2018   (JP) .............................. JP2018-047636

(51) Int. Cl.
*G03B 17/56* (2021.01)
*B60R 11/04* (2006.01)
(Continued)

(52) U.S. Cl.
CPC ............ *G03B 17/561* (2013.01); *B60R 11/04* (2013.01); *G03B 35/08* (2013.01); *B60R 2011/004* (2013.01); *B60R 2011/0066* (2013.01)

(58) Field of Classification Search
None
See application file for complete search history.

(56) References Cited

U.S. PATENT DOCUMENTS 10,728,435 B2 *   7/2020   Rendlen ............... H04N 5/2257
10,928,629 B2 *   2/2021   Ohsumi ............... H04N 5/2254
(Continued)

FOREIGN PATENT DOCUMENTS

JP    2001-332878 A    11/2001
JP    2013-545347 A    12/2013
(Continued)

OTHER PUBLICATIONS

International Search Report (PCT/ISA/210) issued in PCT Application No. PCT/JP2019/008757 dated Jun. 18, 2019 with English translation (four (4) pages).
(Continued)

*Primary Examiner* — Clayton E. LaBalle
*Assistant Examiner* — Leon W Rhodes, Jr.
(74) *Attorney, Agent, or Firm* — Crowell & Moring LLP (57) ABSTRACT

The present invention provides a stereo camera device with which it is possible to prevent the deformation of a housing caused by a warp or strain imposed on a cover and a difference in the rate of increase of the temperature of the housing and the cover, as well as to reduce the size of the housing and to cut down component counts and assembly man-hours. In the present invention, fixing of a substrate and a housing together and fixing of a cover and the housing together are performed in common, and the substrate and the cover are fixed to the housing at the same (common) fixing point, whereby a warp or strain imposed on the cover and a difference in the rate of increase of the temperature of the housing and the cover are absorbed by an elastic body that is used for floating/fixing and is provided for the purpose of cancelling a difference in the amount of contraction and expansion caused by a difference in the coefficient of linear expansion of the substrate and the housing.

10 Claims, 8 Drawing Sheets

(51) Int. Cl.
*G03B 35/08* (2021.01)
*B60R 11/00* (2006.01)

(56) References Cited

U.S. PATENT DOCUMENTS

| | | | |
|---|---|---|---|
| 10,931,932 B2* | 2/2021 | Kazama | H04N 13/239 |
| 2012/0081550 A1 | 4/2012 | Sewell | |
| 2016/0006911 A1 | 1/2016 | Kimura et al. | |
| 2016/0255260 A1* | 9/2016 | Huang | H04N 5/2253 |
| | | | 348/262 |

FOREIGN PATENT DOCUMENTS

| | | |
|---|---|---|
| JP | 2015-198224 A | 11/2015 |
| JP | 2016-14564 A | 1/2016 |

OTHER PUBLICATIONS

Japanese-language Written Opinion (PCT/ISA/237) issued in PCT Application No. PCT/JP2019/008757 dated Jun. 18, 2019 (four (4) pages).

* cited by examiner

B—B CROSS-SECTIONAL VIEW

FIG. 8

STEREO CAMERA DEVICE

TECHNICAL FIELD

The present invention relates to a stereo camera device.

BACKGROUND ART

PTL 1 discloses, as a camera device in which a substrate is attached to a housing including an imaging unit, a configuration in which at least one fixing means for fixing the substrate to the housing and at least one floating support means for supporting the substrate to the housing to be movable in a direction in which the substrate is closer to and is farther from fixing points fixed by the fixing means are provided. Accordingly, it is possible to align a position of the substrate relative to the housing, and it is possible to prevent the housing from being distorted due to occurrence of stress between the housing and the substrate during thermal expansion. Specifically, in PTL 1, a difference in the amount of contraction or expansion during temperature application due to a difference in linear expansion coefficient between the substrate and the housing is canceled by the floating support means for fixing the substrate and the housing.

CITATION LIST

Patent Literature

PTL 1: JP 2015-198224 A

SUMMARY OF INVENTION

Technical Problem

Incidentally, in the structure of the related art described in PTL 1, the housing to which the substrate is attached has a thin elongated rectangular shape extending to the left and the right with a substantially constant width, includes a pair of imaging units provided at both end portions in a longitudinal direction, and houses the substrate therein in cooperation with a cover (lower cover). However, fixing is separately performed between the substrate and the housing and between the cover and the housing, and the cover and the housing are rigidly fixed (integrated) at a plurality of fixing points.

Thus, when the cover is fixed to the housing, there is a concern that the warpage and distortion of the cover deform the housing. There is a concern that the rigid fixing between the housing and the cover deforms the housing during a repeated thermal change caused by heat generation of electronic components (heat generation components) mounted on the substrate from a difference in temperature rise rate between the housing and the cover. As described in PTL 1, when the housing is deformed in this manner, there is a concern that an error in optical axis between the imaging units provided at both end portions of the housing, attachment accuracy when the housing is attached at an attachment position, and the like are influenced.

Since the fixing of the substrate and the housing and the fixing of the cover and the housing are separately performed, an area required for the fixing becomes large, the size of the housing becomes large. Thus, there is a concern that the number of components and the number of assembling steps become large.

The present invention has been made in view of the above circumstances, and an object of the present invention is to provide a stereo camera device capable of preventing deformation of a housing caused by warpage and distortion of a cover and a difference in temperature rise rate between the housing and the cover and achieving a reduction in size of the housing and reductions in the number of components and the number of assembling steps.

Solution to Problem

In order to solve the above problems, a stereo camera device includes first and second imaging units, a housing that includes the first and second imaging units, a substrate that receives signals from the first and second imaging units, and has a linear expansion coefficient different from a linear expansion coefficient of the housing, a cover that houses the substrate in cooperation with the housing, and has a linear expansion coefficient different from the linear expansion coefficient of the substrate, a first fixing portion that co-fastens the substrate and the cover to the housing by a first fixing member without an elastic body interposed between the cover and the first fixing member, and a second fixing portion that co-fastens the substrate and the cover to the housing by a second fixing member with an elastic body interposed between the cover and the second fixing member. The elastic body is configured to cause elastic deformation or sliding between the substrate and the cover so as to be allowable even though the cover holds a slight displacement from the substrate, and the first fixing portion is provided at a position closer to a central point of a line segment connecting the first imaging unit and the second imaging unit than the second fixing portion.

Advantageous Effects of Invention

According to the present invention, the substrate and the cover are co-fastened to the housing. That is, the fixing of the substrate and the housing and the fixing of the cover and the housing are performed as the common fixing, and the substrate and the cover are fixed to the housing at the same (common) fixing points. Thus, the warpage and distortion of the cover and the difference in the temperature rise rate between the housing and the cover can be absorbed by the elastic body used for the floating fixing in order to cancel the difference in the amount of contraction or expansion during the temperature application due to the difference in the linear expansion coefficient between the substrate and the housing. Accordingly, it is possible to prevent the deformation of the housing caused by such warpage, distortion, and difference.

Further, by fixing the substrate and the cover to the housing at the same fixing point, the area occupied by the fixing is reduced, the size of the housing can be reduced, and the number of parts and the number of assembly steps can be reduced.

Other objects, configurations, and effects will be made apparent in the following descriptions.

BRIEF DESCRIPTION OF DRAWINGS

FIGS. 1A and 1B are diagrams schematically illustrating a vehicle equipped with an embodiment of a stereo camera device according to the present invention, FIG. 1A is a top view, and FIG. 1B is a side view.

FIGS. 2A to 2C are diagrams illustrating the embodiment of the stereo camera device according to the present invention, FIG. 2A is a top view, FIG. 2B is a front view, and FIG. 2C is a bottom view.

DESCRIPTION OF EMBODIMENTS

Hereinafter, embodiments of the present invention will be described with reference to the drawings.

<Configuration of Vehicle 1000 Equipped with Stereo Camera Device 100>

Figure 1A:
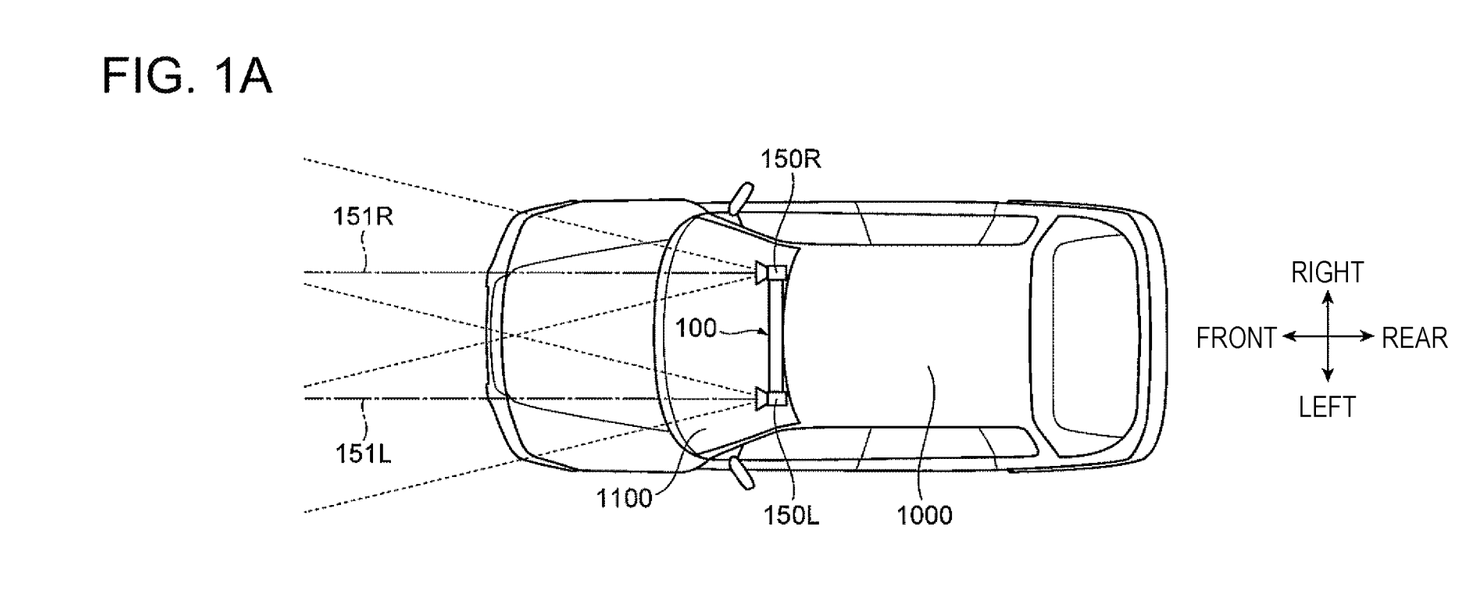
Figure 1B:
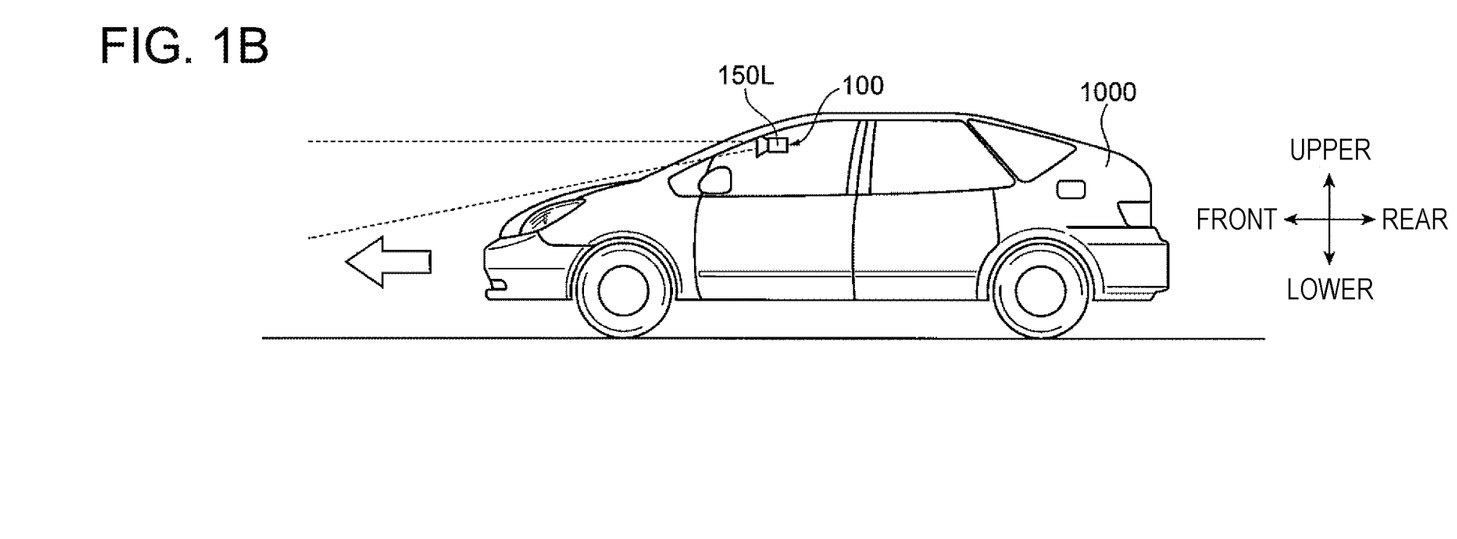

FIG. 1 is a diagram schematically illustrating a vehicle equipped with an embodiment of a stereo camera device according to the present invention. FIG. 1(a) is a top view, and FIG. 1(b) is a side view.

As illustrated in FIGS. 1(a) and 1(b), the stereo camera device 100 of the illustrated embodiment is arranged in a vehicle cabin of the vehicle 1000, and images forward of the vehicle 1000 through a windshield 1100. The stereo camera device 100 has a pair of left and right imaging units 150R and 150L as illustrated in FIG. 1(a). For example, the imaging units 150R and 150L are arranged to face the front such that optical axes 151R and 151L are substantially parallel (in a front-rear direction), and a distance image is generated by calculating parallax from a pair of images captured by the imaging units 150R and 150L. The distance image generated by the stereo camera device 100 is used for vehicle control for avoiding collision with obstacles such as other vehicles and pedestrians, lane keeping control for traveling while maintaining a predetermined lane, warning, and the like.

<Configuration of Stereo Camera Device 100>

Figure 2A:
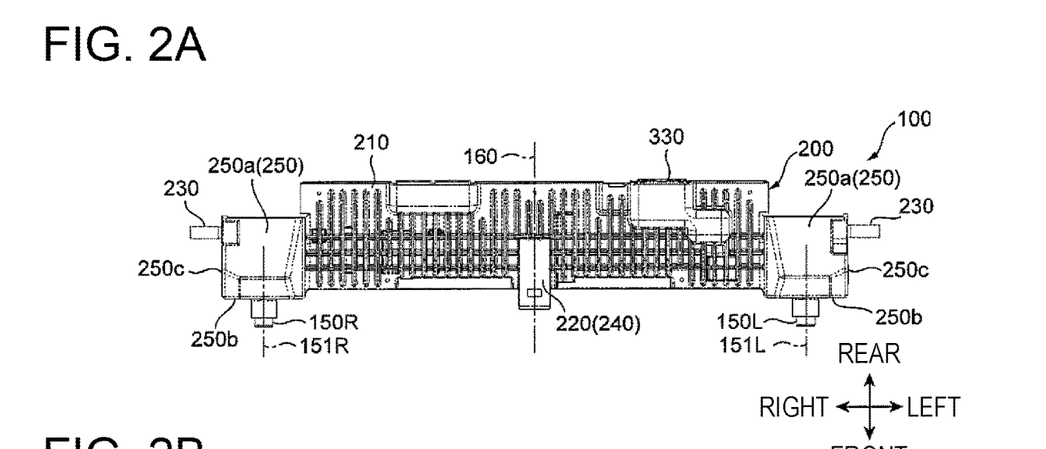
Figure 2B:
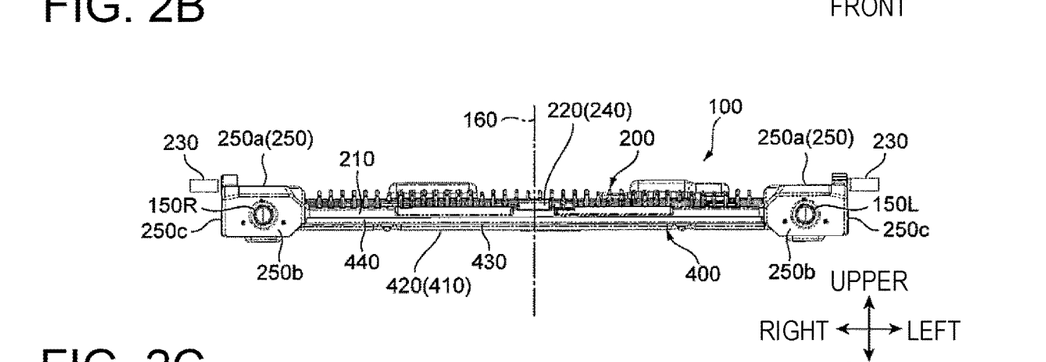
Figure 2C:
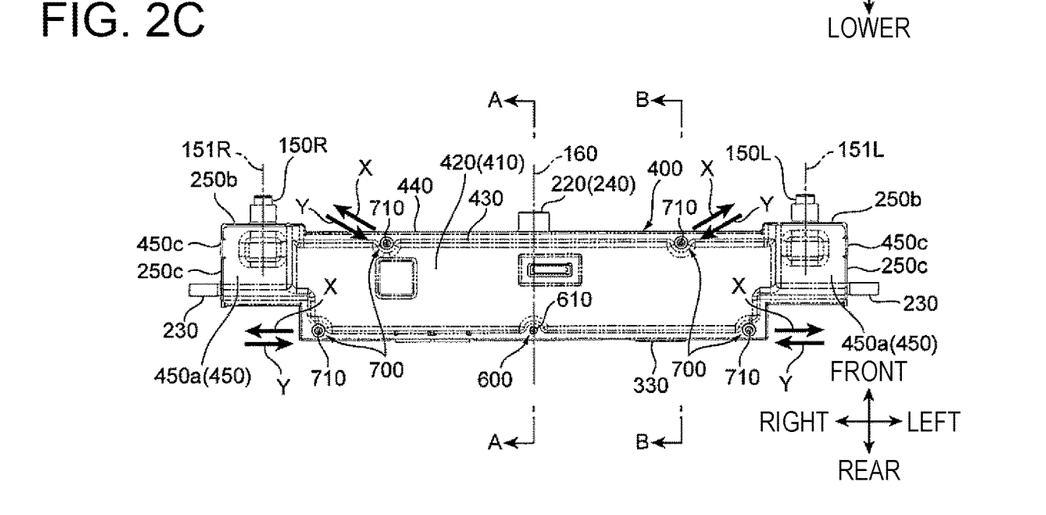
Figure 3:
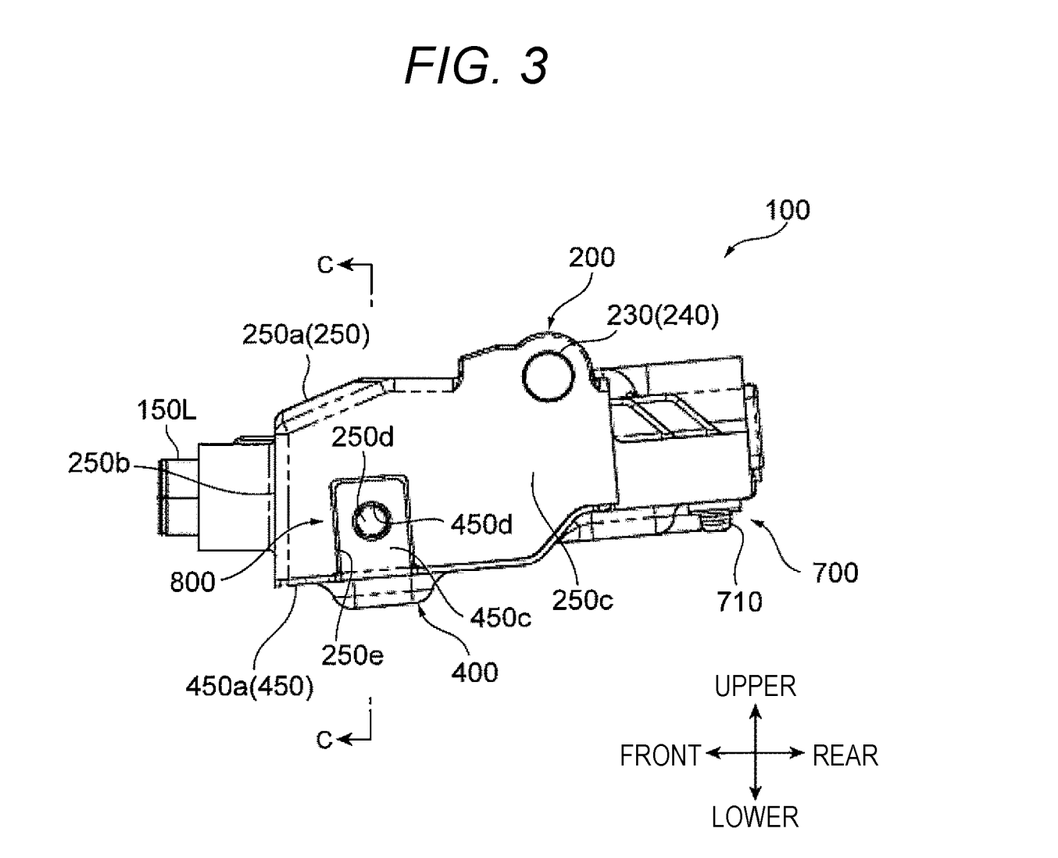
FIG. 3 is a left side view illustrating the embodiment of the stereo camera device according to the present invention.
Figure 4:
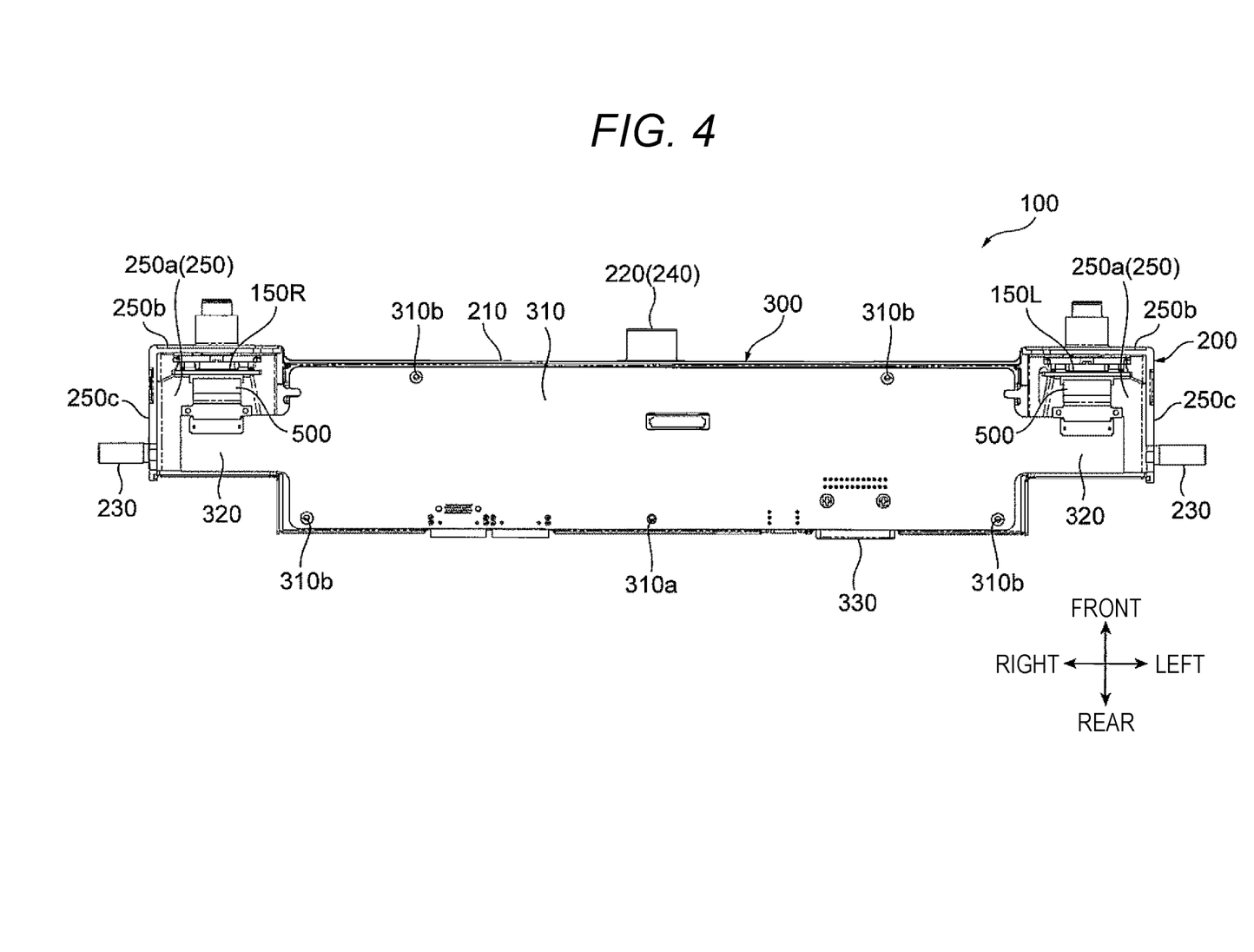
FIG. 4 is a bottom view illustrating a state in which a cover of FIG. 2C is removed.
Figure 5:
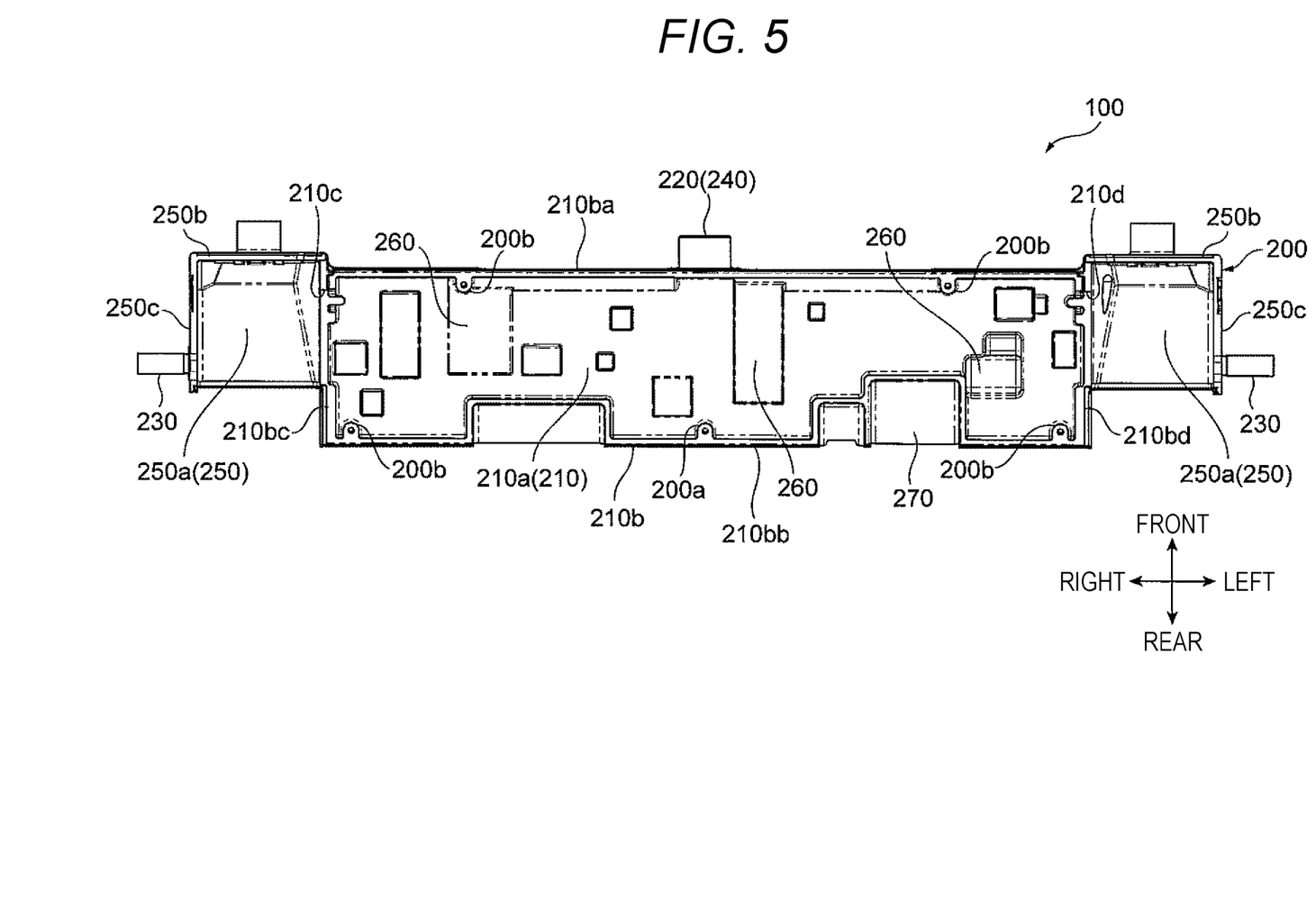
FIG. 5 is a bottom view illustrating a state in which the cover, a substrate, and imaging units of FIG. 2C are removed.

FIGS. 2(a) to 2(c) and FIG. 3 are external views of the stereo camera device 100. FIG. 2(a) is a top view, FIG. 2(b) is a front view, FIG. 2(c) is a bottom view, and FIG. 3 is a left side view. FIG. 4 is a bottom view illustrating a state in which a cover 400 of FIG. 2(c) is removed, and FIG. 5 is a bottom view illustrating a state in which the cover, a substrate, and the imaging unit of FIG. 2(c) are removed (that is, a state in which a substrate 300 and the imaging units 150R and 150L are further removed from FIG. 4).

The stereo camera device 100 basically includes a housing 200 having imaging units 150R and 150L, the substrate 300 attached to the housing 200 so as to receive and process signals (captured images) from the imaging units 150R and 150L, and the cover 400 attached to the housing 200 so as to house the imaging units 150R and 150L and the substrate 300 in cooperation with the housing 200.

[Configuration of Housing 200]

The housing 200 is made of a metal material such as an aluminum alloy, and has a thick elongated rectangular shape extending to the left and right with a substantially constant width, and the imaging units 150R and 150L are provided at both end portions in a longitudinal direction (that is, a left-right direction).

Specifically, as can be seen by referring to FIG. 5, the housing 200 includes, for example, a substrate mounting portion 210 that is provided at a central portion of the housing 200 for mounting the substrate 300, a pair of camera fixing portions 250 that are provided at both left and right end portions (that is, both left and right ends of the substrate mounting portion 210) of the housing 200 for fixing the imaging units 150R and 150L, respectively, and a vehicle body member fixing portion 240 that attaches and fixes the housing 200 to a vehicle body member (not illustrated) attached to the windshield 1100 and the like in the vehicle cabin.

As illustrated in FIG. 5, the substrate mounting portion 210 has a shallow bottom flat box shape including an inner surface portion 210a that has a substantially rectangular shape in plan view and a vertical wall portion 210b that is erected so as to be continuous in a circumferential or annular shape along a peripheral edge of the inner surface portion 210a. The substrate 300 is mounted at the vertical wall portion 210b, and mounted components of the substrate 300 are housed in an internal space surrounded by the inner surface portion 210a and the vertical wall portion 210b.

Bosses 200a and 200b (a boss 200a for the rigid fixing portion and bosses 200b for the floating fixing portions) having screw holes to which a co-fastening fixing screw 610 and stepped screws 710 to be described below are screwed and fastened are consecutively provided at a front wall portion 210ba and a rear wall portion 210bb constituting the vertical wall portion 210b of the substrate mounting portion 210. In the present embodiment, the bosses 200a and 200b are provided at a total of five locations, that is, two left and right locations of the front wall portion 210ba and a center and two locations near left and right ends of the rear wall portion 210bb (to be described in detail later). Notch portions 210c and 210d through which connection plate portions 320 having relatively narrow widths (having small widths in the front-rear direction) which are provided at both left and right ends of the substrate 300 and extend to the camera fixing portions 250 pass are provided at a left side wall portion 210bc and a right side wall portion 210bd of the vertical wall portion 210b.

The pair of camera fixing portions 250 include extension portions 250a that extend in a direction in which the fixing portions are away from each other from the substrate mounting portion 210, vertical suspension front surface portions 250b having substantially rectangular shapes in front view that are bent at front ends of the extension portions 250a and are suspended downward, and vertical suspension side surface portions 250c having substantially rectangular shapes in side view that are bent at side ends (left side ends or right side ends) of the extension portions 250a (that is, a left end or a right end of the housing 200) and are suspended downward. That is, each camera fixing portion 250 has a vertical cross-sectional shape of an L shape, and the imaging units 150R and 150L are fixed to inner surfaces of the vertical suspension front surface portions 250b such that front end portions protrude from front surfaces of the vertical suspension front surface portions 250b.

Figure 8:
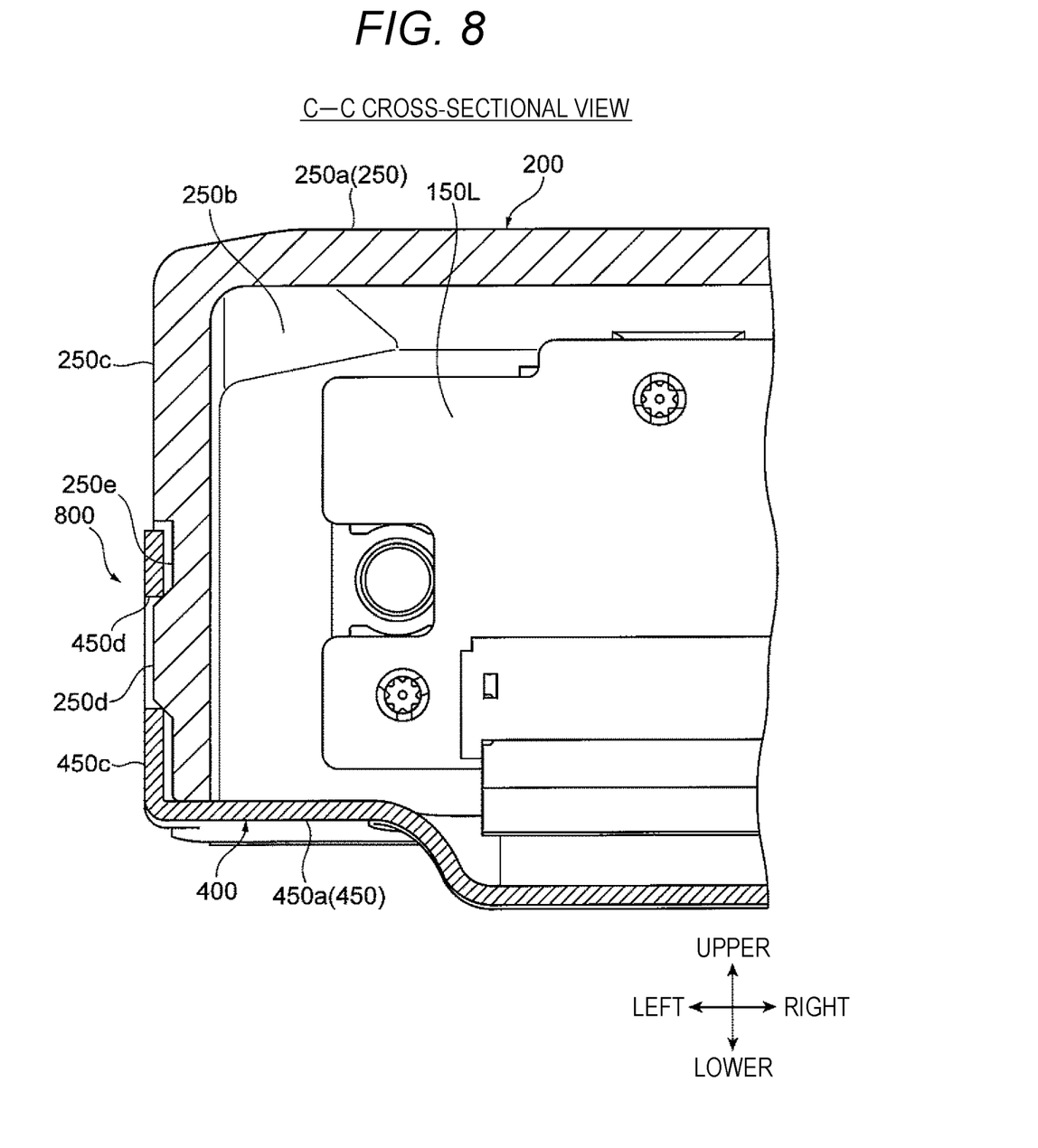
FIG. 8 is a cross-sectional view taken along an arrow C-C of FIG. 3.

As can be seen by referring to FIGS. 3 and 8, reception recesses 250e that have rectangular shapes in side view and hollow shapes and have dimensions (outer shapes in side view and depths) with which rising engagement surface portions 450c of the cover 400 are received (from a lower side) are formed near front ends of lower portions of outer surfaces of the vertical suspension side surface portions 250c, and engagement protrusion portions 250d fitted into engagement holes 450d including through-holes formed in the rising engagement surface portions 450c are provided near centers of the reception recesses 250e so as to latch (the rising engagement surface portions 450c of) the cover 400.

The vehicle body member fixing portion 240 includes a front vehicle body member fixing portion 220 having a rectangular shape that protrudes forward from a substantially central front end of the substrate mounting portion 210, and a pair of side vehicle body member fixing portions 230 having pin shapes that are provided so as to protrude outward (in the left-right direction) from rear ends of upper portions of outer surfaces of the vertical suspension side surface portions 250c of the pair of camera fixing portions 250. The housing 200 (that is, the stereo camera device 100) is latched and fixed to the vehicle body member by fitting the front vehicle body member fixing portion 220 into a fitting hole or the like of the vehicle body member (not illustrated) attached to the windshield 1100 or the like in the vehicle cabin, similarly fitting the side vehicle body member fixing portions 230 into V grooves or the like of the vehicle body member, and pressing the front vehicle body member fixing portion 220 and the side vehicle body member fixing portions 230 by using spring structures or the like formed at the vehicle body member.

The imaging units 150R and 150L arranged at the pair of camera fixing portions 250 include an imaging element such as a CCD or a CMOS and a lens. The optical axes 151R and 151L of the lenses of the imaging units 150R and 150L are aligned so as to be substantially parallel to each other, and are fixed to the vertical suspension front surface portions 250b of the camera fixing portions 250 via flange shapes of the lenses. As illustrated in FIG. 4, the imaging units 150R and 150L are connected to the connection plate portions 320 at both the left and right ends of the substrate 300, and signal cables 500 for outputting the signals of the captured images to the substrate 300 are connected.

Since the stereo camera device 100 calculates the parallax based on the pair of images captured by the imaging units 150R and 150L, it is necessary to suppress displacement and vibration of attachment positions of the imaging units 150R and 150L in order to ensure calculation accuracy of the parallax. Thus, the housing 200 having the imaging units 150R and 150L is made of a lightweight metal material so as to obtain rigidity of a predetermined value or more, and is formed by casting an aluminum alloy in the present embodiment.

[Configuration of Substrate 300]

For example, the substrate 300 is made of a material including a synthetic resin such as glass epoxy, and various electronic components for constituting an electronic circuit are mounted on a substrate body 310 having an elongated rectangular shape arranged on (the vertical wall portion 210b of) the substrate mounting portion 210 as can be seen by referring to FIG. 4. As described above, the connection plate portions 320 having the relatively narrow widths that extend to the rear side of the imaging units 150R and 150L of the camera fixing portions 250 and are connected to the signal cables 500 via the notch portions 210c and 210d provided at the left side wall portion 210bc and the right side wall portion 210bd of the vertical wall portion 210b extend outward (in the left-right direction) at the centers of both the left and right ends of the substrate body 310 in the front-rear direction.

A small-diameter through-hole 310a or large-diameter through-holes 310b into which the co-fastening fixing screw 610 or the stepped screws 710 to be described below are inserted are formed at positions of a peripheral edge of the substrate body 310 which correspond to the bosses 200a and 200b of the substrate mounting portion 210, specifically, at a total of five locations of two left and right locations of a front edge of the substrate body 310 and a center and two locations near left and right ends of a rear edge (to be described in detail later).

A connector 330 into and from which a communication cable for communicating with an ECU of the vehicle 1000 is inserted and removed is provided at the substrate body 310. The connector 330 is arranged at a position that is continuous to an opening hole 270 (see FIG. 5) opened in a rear surface of (the rear wall portion 210bb of the vertical wall portion 210b of) the substrate mounting portion 210, and the communication cable is inserted and removed into and from the connector rearward of the substrate mounting portion 210.

Among the electronic components mounted on the substrate 300, electronic components such as a microcomputer, an LSI, and a power supply regulator generate heat through energization, and thus, these electronic components are collectively referred to as heat generation components. As illustrated in FIG. 5, in order to positively absorb the heat of these heat generation components, protrusion portions 260 serving as heat sinks are provided at the inner surface portion 210a of the substrate mounting portion 210 at positions corresponding to the heat generation components, and a clearance with the substrate 300 is reduced to a constant value or less. When a heat dissipation member (not illustrated) is interposed in an air layer forming the clearance or the clearance, the heat of the heat generation component is transferred to the protrusion portions 260 via the heat dissipation member, and is diffused and dissipated to the entire housing 200.

[Construction of Cover 400]

For example, the cover 400 is made of a metal material such as an aluminum alloy, and has a thin elongated rectangular shape of which a shape in plan view is substantially the same as the housing 200 (the outer shapes of the substrate mounting portion 210 and the camera fixing portions 250).

Figure 6:
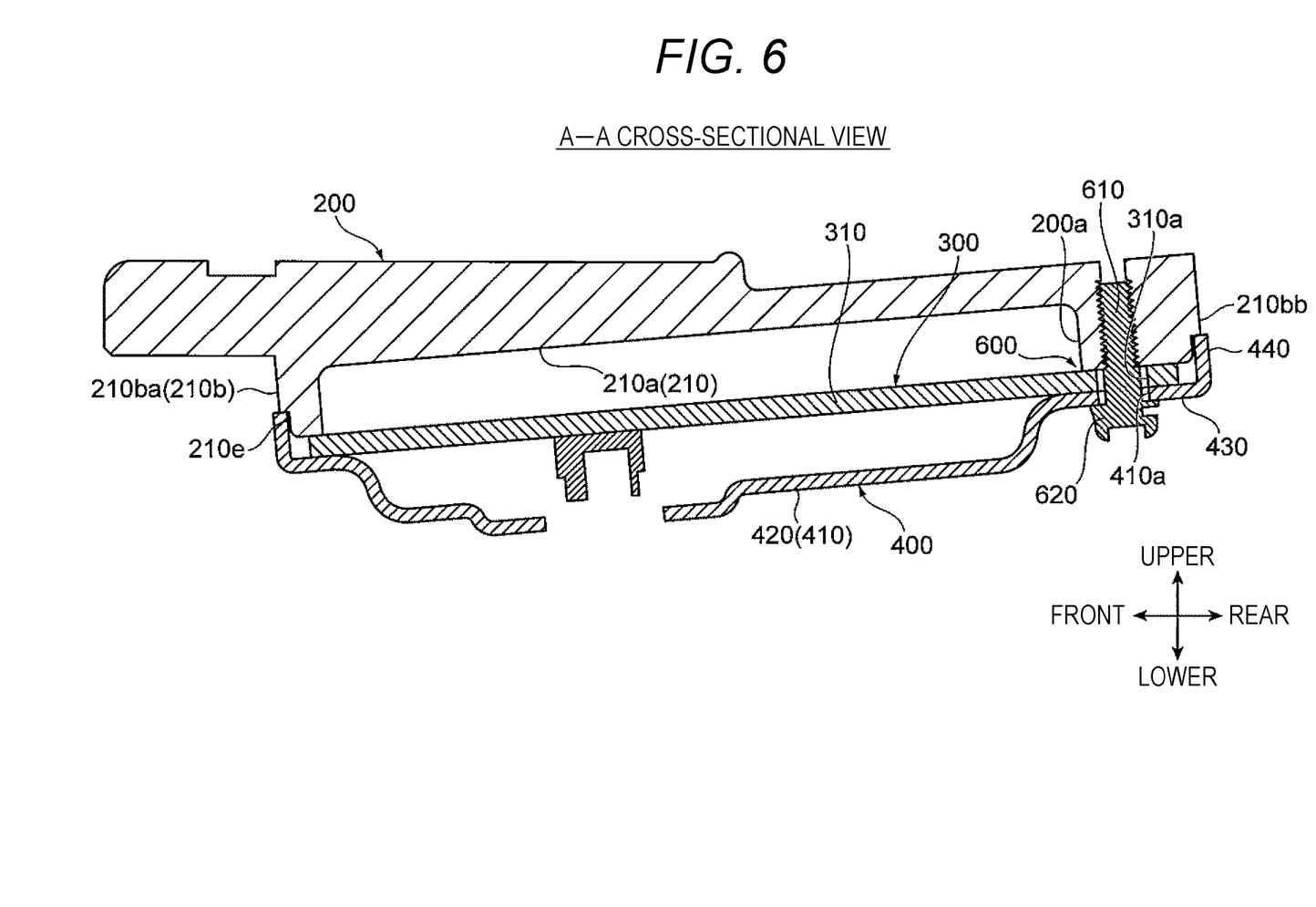
FIG. 6 is a cross-sectional view taken along an arrow A-A of FIG. 2C.
Figure 7:
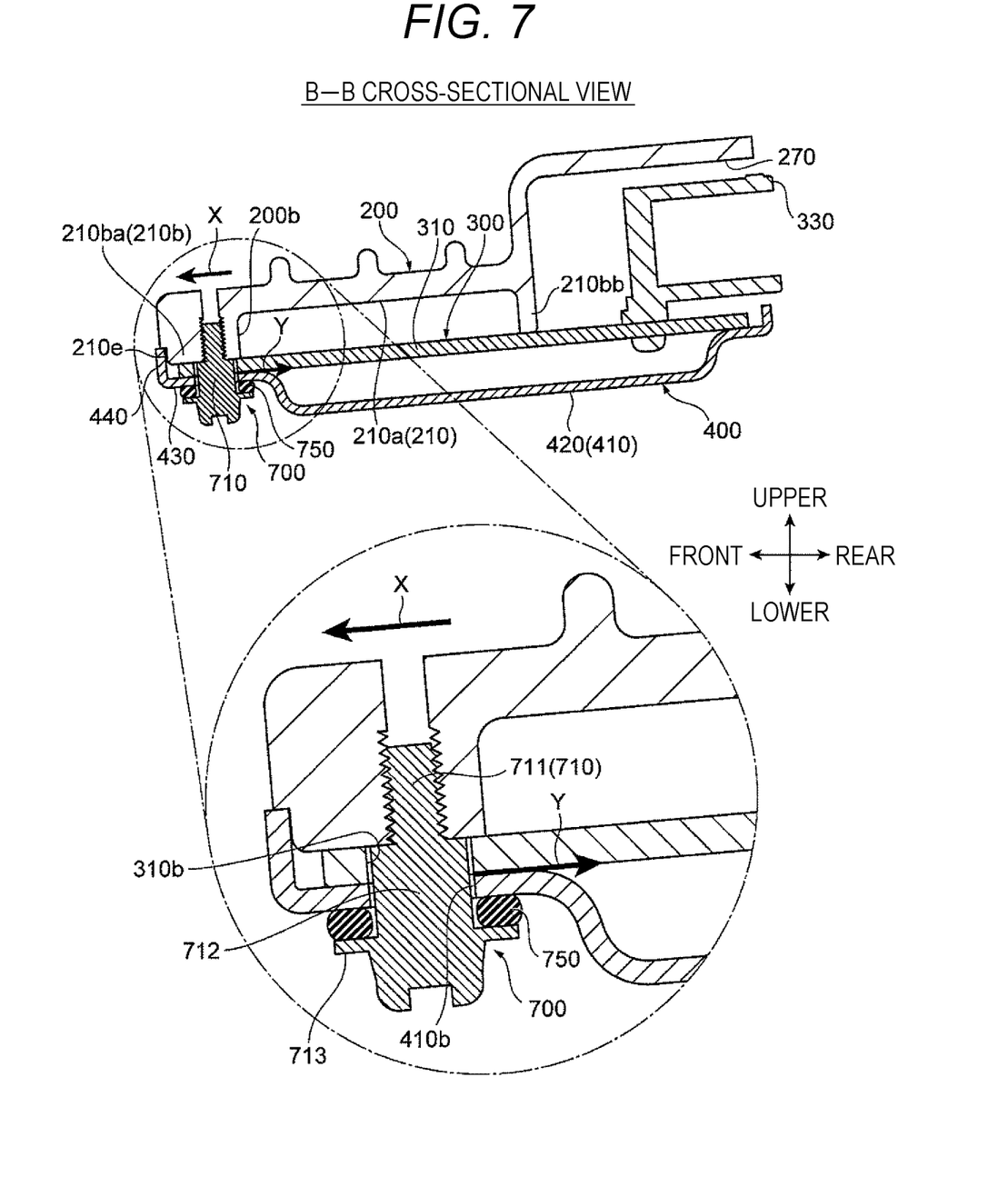
FIG. 7 is a cross-sectional view taken along an arrow B-B of FIG. 2C.

Specifically, as can be seen by referring to FIGS. 2(c), 6, and 7, the cover 400 includes, for example, a substrate cover portion 410 that is provided at a central portion of the cover 400 and covers a lower surface side of the substrate body 310 or the like of the substrate 300 arranged at the substrate mounting portion 210 of the housing 200, and a pair of camera cover portions 450 that are provided at both left and right end portions (that is, both left and right ends of the substrate cover portion 410) of the cover 400 and cover lower surface sides of the imaging units 150R and 150L (and the connection plate portions 320 of the substrate 300) or the like fixed to the camera fixing portions 250 of the housing 200.

The substrate cover portion 410 includes a bottom surface portion 420 having a substantially rectangular shape in plan view and a shallow bottom flat box shape, an abutment surface portion 430 having a predetermined width that extends outward in a flange shape so as to be continuous in a circumferential or annular shape along a peripheral edge (upper end) of the bottom surface portion 420, and an outer peripheral wall portion 440 that is erected upward so as to be continuous in a circumferential or annular shape along a peripheral edge (outer edge) of the abutment surface portion 430. The abutment surface portion 430 of the substrate cover portion 410 is formed so as to face an upper surface of the vertical wall portion 210b of the substrate mounting portion 210 that supports (the peripheral edge of the substrate body 310 of) the substrate 300. The substrate cover portion 410 is configured such that the abutment surface portion 430 abuts on the peripheral edge of the substrate body 310 of the substrate 300 mounted on the upper surface of the vertical wall portion 210b of the substrate mounting portion 210, the outer peripheral wall portion 440 is externally inserted into and an end surface of the substrate body 310 of the substrate 300 and an outer surface (more specifically, a stepped surface 210e (see FIGS. 6 and 7) formed at a lower portion of the outer surface) of the vertical wall portion 210b of the substrate mounting portion 210, and accordingly houses the substrate body 310 therein in cooperation with the substrate mounting portion 210 of the housing 200.

A small-diameter through-hole 410a or large-diameter through-holes 410b into which the co-fastening fixing screw 610 or the stepped screws 710 to be described below are inserted are formed at positions of the abutment surface portion 430 of the substrate cover portion 410 which correspond to the bosses 200a and 200b of the substrate mounting portion 210, specifically, at a total of five locations of two left and right locations of a front portion of the abutment surface portion 430 of the substrate cover portion 410 and a center and two locations near left and right ends of a rear portion (to be described in detail later).

As can be seen by referring to FIGS. 2(c), 3, and 8, the pair of camera cover portions 450 include, for example, extension portions 450a having substantially square shapes in plan view (may be rectangular shapes) that extend in a direction in which the extension portions are away from each other from the substrate cover portion 410 and have substantially the same shape as the outer shape of the camera fixing portions 250, and rising engagement surface portions 450c having rectangular shapes in side view that are bent at side ends (left side ends or right side ends) (that is, a left end or a right end of the cover 400) of the extension portions 450a and are erected upward. The peripheral edges of the extension portions 450a abut on (are pressed to) the lower ends of the vertical suspension front surface portions 250b and the vertical suspension side surface portions 250c of the camera fixing portions 250 and rear edges of the extension portions 250a, and house the imaging units 150R and 150L therein in cooperation with the camera fixing portions 250. The rising engagement surface portions 450c are formed with a size with which the rising engagement surface portions are fitted into the reception recesses 250e provided on the outer surfaces of the vertical suspension side surface portions 250c of the camera fixing portions 250, and the engagement holes 450d including round holes into which the engagement protrusion portions 250d provided at the reception recesses 250e are fitted are provided near the centers of the rising engagement surface portions 450c.

The cover 400 is locked to the housing 200 and is fixed so as not to freely vibrate during vibration by a hooking structure 800 that includes the engagement holes 450d provided in the rising engagement surface portions 450c and the engagement protrusion portions 250d provided in the reception recesses 250e of the housing 200. More specifically, the cover 400 is latched by being hooked to the housing 200 by aligning the rising engagement surface portions 450c at both the left and right ends to the reception recesses 250e of the housing 200 while bringing the cover into the housing 200 from the lower side and bending the cover 400 slightly outward (while elastically deforming the cover) by using elasticity of the cover 400 (at this time, the outer peripheral wall portion 440 of the substrate cover portion 410 are externally inserted into the vertical wall portion 210b of the substrate mounting portion 210), pressing the rising engagement surface portions 450c to the reception recesses 250e of the housing 200 by an elastic restoring force of the cover 400, and fitting the engagement holes 450d of the rising engagement surface portions 450c into the engagement protrusion portions 250d of the reception recesses 250e.

[Co-Fastening Configuration of Housing 200, Substrate 300, and Cover 400]

As described above, in the stereo camera device 100 of the present embodiment, after the cover 400 is hooked to the housing 200 by the hooking structure 800 (with the substrate 300 interposed therebetween), the substrate 300 together with the cover 400 is secured to the housing 200 at a total of five locations (in other words, the substrate 300 and the cover 400 are arranged in sequence so as to abut on the housing 200 and are co-fastened). More specifically, the front portion of the substrate 300 is divided into left and right portions and is secured at two locations, and the rear portion of the substrate 300 is secured at three locations of left, right, and central portions as illustrated in FIG. 2(c).

Here, the aluminum alloy used for the housing 200 and the cover 400 and the glass epoxy material used for the substrate body 310 have different linear expansion coefficients, and the aluminum alloy has a higher coefficient of thermal expansion than the glass epoxy material.

Thus, for example, when all a plurality of locations of the substrate 300 is integrally fixed to the housing 200 so as not to move, that is, when the substrate is rigidly fixed to the housing, since the housing 200 further extends than the substrate 300 due to thermal expansion, the housing 200 is pulled by the substrate 300, and thus, there is a concern that a bending stress acts on the housing 200.

In particular, as in the present embodiment, when the housing 200 has the thick elongated rectangular shape, the amount of extension in the longitudinal direction (left-right direction) is large. Thus, when all the plurality of locations of the substrate 300 is rigidly fixed, the housing 200 is likely to be distorted due to the bending stress, and thus, there is a concern that the positions or the like of the imaging units 150R and 150L provided at both the ends thereof are changed. When the positions or the like of the imaging units 150R and 150L are changed, a base line length and the setting of a geometric system with the vehicle are changed, and thus, there is a concern that detection accuracy of the parallax is influenced.

In order to solve this problem, the technology of the related art described in PTL 1 presents a configuration includes, as a structure for holding the substrate in the housing, at least one fixing means for fixing the substrate to the housing and at least one floating support means for supporting the substrate to the housing to be movable in a direction in which the substrate is closer to and is farther from the fixing points fixed by the fixing means. Thus, it is possible to align a position of the substrate relative to the housing, and it is possible to prevent the housing from being distorted due to the occurrence of stress between the housing and the substrate during thermal expansion.

However, as described above, in the structure of the related art described in PTL 1, fixing is separately performed between the substrate and the housing and between the cover and the housing, and when the cover is fixed to the housing, warpage and distortion of the cover cause the deformation of the housing side.

As in the present embodiment, even when the housing 200 and the cover 400 are made of the same material and have the same linear expansion coefficient, a thickness and a volume of the housing 200 are generally larger than those in the cover 400 and surface areas of the housing 200 and the cover 400 in contact with an outside air are different. Thus, when a repeated heat change is applied from a difference in the volume and a difference in temperature rise rate between the housing and the cover caused by the surface areas or the like in contact with the outside air, displacements in the positions of the fixing points are accumulated due to the rigid fixing between the housing and the cover, and thus, there is a possibility that the housing is gradually deformed.

Accordingly, as described above, in the stereo camera device 100 of the present embodiment, the housing 200, the substrate 300, and the cover 400 are co-fastened (in other words, the substrate 300 and the cover 400 are fixed to the housing 200 at the same (common) fixing points), only one position in the rear center of the substrate 300 is a rigid fixing portion (first fixing portion) 600, only one location of the center of the rear portion of the substrate 300 among the fixing points (fastening points) of the five locations is fixed by the rigid fixing portion (first fixing portion) 600 in a state in which the substrate 300 and the cover 400 are aligned with the housing 200 so as not to move, and the remaining four locations are fixed by floating fixing portions (second fixing portions) 700 using elastic bodies 750 such that the substrate 300 and the cover 400 are elastically to the housing 200 (in other words, by using elastic force of the elastic bodies 750 interposed between the substrate and the cover).

That is, in the present embodiment, the fixing points (fastening points) positioned at the positions (that is, close to the central point between the imaging unit 150R and the imaging unit 150L) close to a central point of a line segment that connects the optical axis 151R of the imaging unit 150R and the optical axis 151L of the imaging unit 150L, more specifically, on a plane 160 which passes through the central point and is perpendicular to the line segment are fixed by using the rigid fixing portion (first fixing portion) 600. The fixing points (fastening points) of the four locations positioned at the positions (that is, close to the imaging unit 150R or close to the imaging unit 150L) far from the central point, more specifically, at the positions (in other words, both of the imaging unit 150R side and the imaging unit 150L side with the plane 160 interposed therebetween) closer to the imaging unit 150R or the imaging unit 150L than the plane 160 are fixed by using the floating fixing portions (second fixing portions) 700 using the elastic bodies 750 (see FIGS. 2(*a*) to 2(*c*)).

Since the floating fixing portions 700 support the substrate 300 in the housing 200 so as to be expandable and contractable in the direction in which the substrate is closer to and farther from the fixing point fixed by the rigid fixing portion 600, when the housing 200 further expands than the substrate 300 due to a difference in the linear expansion coefficient caused by the thermal expansion of the substrate 300 and the housing 200, it is possible to prevent the housing 200 from being pulled by the substrate 300 (see PTL 1). In addition, in the stereo camera device 100 of the present embodiment, since the cover 400 is also co-fastened by using the same fixing points, it is possible to prevent the housing 200 from being pulled by the cover 400 due to the repeated thermal change from the difference in the temperature rise rate between the housing 200 and the cover 400.

The elastic bodies 750 used by the floating fixing portions 700 are deformed by being compressed and uncompressed, and the substrate is rigidly fixed to the housing. At this time, it is possible to absorb an excess force caused by the warpage and distortion of the cover 400 that deforms the housing 200.

Hereinafter, an example of a detailed structure of the rigid fixing portion 600 and the floating fixing portions 700 in the co-fastening fixing configuration of the housing 200, the substrate 300, and the cover 400 will be described with reference to FIGS. 6 and 7.

FIG. 6 is a cross-sectional view taken along an arrow A-A of FIG. 2(*c*), and is a cross-sectional view for describing an example of a structure of the rigid fixing portion 600. FIG. 7 is a cross-sectional view taken along an arrow B-B of FIG. 2(*c*), and is a cross-sectional view for describing an example of a structure of the floating fixing portion 700.

The rigid fixing portion 600 is positioned on the plane 160 that passes through the central point of the line segment connecting the optical axis 151R of the imaging unit 150R and the optical axis 151L of the imaging unit 150L and is perpendicular to the line segment, and includes the screw hole that is screwed to the boss 200*a* provided in the center of the rear wall portion 210*bb* constituting the vertical wall portion 210*b* of the substrate mounting portion 210 of the housing 200, and the fixing screw (first fixing member) 610 that is inserted into the small-diameter through-hole 410*a* provided in the center of the rear portion of the abutment surface portion 430 of the substrate cover portion 410 of the cover 400 and the small-diameter through-hole 310*a* provided in the center of the rear edge of the substrate body 310 of the substrate 300 and is screwed into the screw hole, as illustrated in FIG. 6. In this rigid fixing portion 600, the substrate 300 and the cover 400 are arranged so as to be overlapped by abutting on the boss 200*a* of the housing 200 in this order (in other words, the substrate 300 is arranged so as to be interposed between the boss 200*a* of the housing 200 and the cover 400). The fixing screw 610 is inserted into the small-diameter through-hole 410*a* of the cover 400 and the small-diameter through-hole 310*a* of the substrate 300, and the fixing screw 610 is fastened to (the screw hole of) the boss 200*a*. Accordingly, the substrate body 310 and the cover 400 are fixed while being interposed together between a head 620 of the fixing screw 610 and the boss 200*a* (without an elastic body such as an O-ring interposed therebetween).

The substrate 300 and the cover 400 are integrally fixed to the housing 200 by the rigid fixing portion 600, and the substrate 300 is aligned with the housing 200 within a range of a gap between the small-diameter through-hole 310*a* of the substrate body 310 and the fixing screw 610 inserted into the small-diameter through-hole 310*a*.

Meanwhile, the floating fixing portions 700 are provided at the fastening points of the four locations (two locations in front and rear of the imaging unit 150R side from the central point or the plane 160 and two locations in front and rear of the imaging unit 150L side from the central point or the plane 160) other than the fastening point at which the rigid fixing portion 600 is provided. Like one representative floating fixing portion illustrated in FIG. 7, the floating fixing portion includes the screw hole that is screwed to the boss 200*b* provided at the vertical wall portion 210*b* of the substrate mounting portion 210 of the housing 200, and the stepped screw (second fixing member) 710 which is inserted into the large-diameter through-hole 410*b* provided at the abutment surface portion 430 of the substrate cover portion 410 of the cover 400 and the large-diameter through-hole 310*b* provided at the substrate body 310 of the substrate 300 and of which a screw shaft portion 711 of a front end is screwed into the screw hole.

The stepped screw 710 includes the screw shaft portion 711 having substantially the same diameter as that of the fixing screw 610, a thick shaft portion 712 having a diameter further enlarged (than the screw shaft portion 711) at a base end, and a flange portion 713 provided at a base end of the thick shaft portion 712 from the elastic body (in the present example, a rubber O-ring) 750 externally fitted into the thick shaft portion 712. The thick shaft portion 712 is inserted into the large-diameter through-hole 410b of the substrate cover portion 410 of the cover 400 and the large-diameter through-hole 310b of the substrate body 310 of the substrate 300 with a predetermined gap.

When the substrate body 310 and the housing 200 are displaced by relatively moving in a sliding direction due to the difference in the linear expansion coefficient between the housing 200 and the substrate body 310, an outer diameter of the thick shaft portion 712 has a size with which a gap allowing relative movement and displacement is formed between the thick shaft portion 712 and the large-diameter through-hole 310b of the substrate body 310 without abutting on the substrate body 310. That is, when the housing 200 and the substrate body 310 thermally expand or contract between the thick shaft portion 712 and the large-diameter through-hole 310b of the substrate body 310, a gap with which the substrate body 310 and the housing 200 are relatively movable (displaceable or displacement is allowed) is formed in the sliding direction.

Similarly, when the movement and displacement in the sliding direction are caused by the accumulation of the difference in the contraction or expansion between the housing 200 and the cover 400 due to the repeated thermal change, the outer diameter of the thick shaft portion 712 has the size with which the gap allowing the relative movement and displacement is formed between the thick shaft portion and the large-diameter through-hole 410b of the cover 400. That is, when the housing 200 and the cover 400 contract or expand due to the repeated thermal change between the thick shaft portion 712 and the large-diameter through-hole 410b of the cover 400, the gap in which the cover 400 and the housing 200 or the substrate body 310 are relatively movable (displaceable or the displacement is allowed) in the sliding direction.

The outer diameter of the thick shaft portion 712 is smaller than an outer diameter of a head surface of the boss 200b, and an outer diameter of the flange portion 713 is substantially equal to or greater than the outer diameter of the head surface of the boss 200b. Thus, the flange portion 713 and the head surface of the boss 200b face each other. A length of the thick shaft portion 712 is set to be longer than a combined dimension of thicknesses of the abutment surface portion 430 of the substrate cover portion 410 of the cover 400 and the substrate body 310 of the substrate 300.

The stepped screw 710 is fixed to the housing 200 by causing a stepped surface between the screw shaft portion 711 and the thick shaft portion 712 to abut on the head surface of the boss 200b, and the flange portion 713 and the head surface of the boss 200b are arranged so as to face each other with a constant distance (specifically, a gap in which the elastic body 750 externally fitted to the thick shaft portion 712 is interposed in a compressed state between the flange portion 713 and (the abutment surface portion 430 of the substrate cover portion 410 of) the cover 400).

Although it has been described in the present example that the elastic body 750 used by the floating fixing portion 700 is the rubber O-ring, a material having predetermined elastic deformability (specifically, a function of allowing predetermined deformation and returning to a shape before deformation) and slipperiness may be used, and a resin material such as silicon, Teflon (registered trademark), or the like may be used.

In this floating fixing portion 700, the substrate 300 and the cover 400 are arranged so as to be overlapped by abutting on the boss 200b of the housing 200 in this order (in other words, the substrate 300 is arranged so as to be interposed between the boss 200b of the housing 200 and the cover 400). The stepped screw 710 of which the thick shaft portion 712 is attached to the elastic body 750 is inserted into the large-diameter through-hole 410b of the cover 400 and the large-diameter through-hole 310b of the substrate 300, and the screw shaft portion 711 is fastened to (the screw hole of) the boss 200b until the stepped surface between the screw shaft portion 711 and the thick shaft portion 712 abuts on the head surface of the boss 200b. Thus, the substrate body 310 and the cover 400 are elastically fixed by being interposed while interposing the elastic body 750 (in the compressed state) between the flange portion 713 of the stepped screw 710 and the boss 200b.

The substrate body 310 is pressed against the boss 200b by the elastic body 750 externally fitted to the thick shaft portion 712 with a predetermined pressing force, and is supported by and fixed to the housing 200 in a state in which the substrate body 310 is movable relative to the boss 200b in the sliding direction.

Accordingly, for example, when a distance between the boss 200a and the boss 200b of the housing 200 is greater than a distance between the small-diameter through-hole 310a and the large-diameter through-hole 310b of the substrate 300 due to the thermal expansion of the housing 200 and the substrate 300 (in an arrow X direction of FIGS. 2(c) and 7), it is possible to move the substrate 300 so as to be slid with respect to the boss 200b (in an arrow Y direction (that is, a direction of the rigid fixing portion 600 at the center) which is an opposite direction to the arrow X direction of FIGS. 2(c) and 7), and it is possible to prevent the housing 200 from being pulled by the substrate 300. Accordingly, it is possible to prevent the housing 200 from being distorted.

Similarly, the cover 400 is pressed against the substrate 300 arranged so as to abut on the boss 200b by the elastic body 750 with a predetermined pressing force, and is supported and fixed to the housing 200 in a state in which the cover 400 is movable relative to the boss 200b in the sliding direction.

Accordingly, for example, in the state in which the temperature of the cover 400 is lowered and the cover thermally contracts earlier than the housing 200, when the distance between the boss 200a and the boss 200b of the housing 200 is greater than the distance between the small-diameter through-hole 410a and the large-diameter through-hole 410b of the cover 400 (in the arrow X direction of FIGS. 2(c) and 7), it is possible to move the cover 400 so as to be slid with respect to the substrate 300 mounted on the boss 200b while sliding against the elastic body 750 (in the arrow Y direction (that is, the direction of the rigid fixing portion 600 at the center) which is the opposite direction to the arrow X direction of FIGS. 2(c) and 7), and it is possible to prevent the substrate 300 (and the housing 200 under the substrate) from being pulled by the cover 400. Thus, it is possible to prevent the housing 200 from being distorted.

For example, in a state in which the cover 400 is warped or distorted, when the cover is fixed by the floating fixing portion 700, it is possible to absorb (cancel) the warp or distortion of the cover 400 by deforming the elastic body 450 arranged between the flange portion 713 and the cover 400, and it is possible to prevent the housing 200 from being distorted due to the warpage and distortion of the cover 400.

<Actions and Effects of Stereo Camera Device 100>

As described above, in the stereo camera device 100 of the present embodiment, the displacements are gradually accumulated at fastening portions of the substrate 300 and the housing 200 due to a change in a temperature within the vehicle cabin and the repeated thermal change caused by the heat generation or the like of the electronic components (heat generation components) mounted on the substrate 300 from a difference in the amount of contraction or expansion during temperature application due to the difference in the linear expansion coefficient between the substrate 300 and the housing 200 (the housing 200 has the linear expansion coefficient (coefficient of thermal expansion) larger than that of the substrate 300), and thus, the housing 200 is pulled by the substrate 300. However, since the housing 200 is pressed against the substrate 300 with a constant pressing force or less by (the elastic body 750 of) the floating fixing portion 700 and the movement in the sliding direction is not restricted, the substrate 300 and the housing 200 slide with one point of rigid fixing (completion fixing) as a center (see the direction arrows X and Y of FIGS. 2(c) and 7), and the difference in the amount of contraction or expansion is absorbed. As a result, the deformation of the housing 200 due to the difference in the linear expansion coefficient between the substrate 300 and the housing 200 does not occur.

The displacements are gradually accumulated at the fastening portion of the housing 200 and the cover 400 due to the repeated thermal change from the difference in the volume between the housing 200 and the cover 400 and the difference in the temperature rise rate between the housing 200 and the cover 400 caused by the surface areas or the like thereof in contact with the outside air, and the housing 200 is pulled by the cover 400. However, since the substrate 300 is pressed against the cover 400 by (the elastic body 750 of) the floating fixing portion 700 with a constant pressing force or less and the movement in the sliding direction is not restricted, the substrate 300 and the cover 400 slide with one point of rigid fixing (completion fixing) as a center (see the direction arrows X and Y of FIGS. 2(c) and 7), and the difference in the temperature rise rate is absorbed. As a result, the deformation of the housing 200 due to the difference in the temperature rise rate between the housing 200 and the cover 400 does not occur.

Since the elastic body 750 used for the floating fixation is deformed between the flange portion 713 and the cover 400, an excessive pressing force caused by the warpage and distortion of the cover 400 is absorbed. As a result, the deformation of the housing 200 due to the warpage and distortion of the cover 400 does not occur.

As described above, according to the stereo camera device 100 of the present embodiment, the substrate 300 and the cover 400 are co-fastened to the housing 200. That is, the fixing of the substrate 300 and the housing 200 and the fixing of the cover 400 and the housing 200 are performed as co-fixing, and the substrate 300 and the cover 400 are fixed to the housing 200 at the same (common) fixing points. Thus, it is possible to absorb the warpage and distortion of the cover 400 and the difference in the temperature rise rate between the housing 200 and the cover 400 by using the elastic body 750 used for the floating fixing in order to cancel the difference in the amount of contraction or expansion during the temperature application due to the difference in the linear expansion coefficient between the substrate 300 and the housing 200, and it is possible to prevent the deformation of the housing 200 caused by such warpage, distortion, and difference. Accordingly, it is possible to reduce an error in the optical axis between the imaging units 150R and 150L provided at both the ends of the housing 200, and it is possible to ensure the attachment accuracy when the housing 200 is attached at the attachment position. Thus, it is possible to stabilize measurement accuracy.

The substrate 300 and the cover 400 are fixed to the housing 200 at the same fixing points, and thus, an area occupied by the fixing is reduced. Accordingly, the size of the housing 200 can be reduced, and the number of components and the number of assembling steps can be reduced.

In the stereo camera device 100 of this embodiment, one reference point is fixed by the rigid fixing portion 600, and the other four points are fixed by the floating fixing portions 700 in the floating manner. Thus, the clearances between the thick shaft portion 712 of the stepped screw 710 and the large-diameter through-hole 310b of the substrate body 310 at the other four points can be appropriately maintained.

Although it has been described in the aforementioned embodiment that only one location of the central portion of the rear portion of the substrate 300 as the reference is fixed by the rigid fixing portion 600 and the remaining four locations are fixed by the floating fixing portions 700, the number of rigid fixing portions 600 is not limited to one. For example, a plurality of rigid fixing portions 600 may be provided at positions at which distances between the rigid fixing portions are short, and the floating fixing portions 700 may be provided at positions at which the distances between the rigid fixing portions 600 are long. The number of floating fixing portions 700 is not limited to four, and may be three or less or five or more. The plurality of floating fixing portions may not be used, and the number of floating fixing portions may be one.

The positions of the rigid fixing portion 600 and the floating fixing portions 700 are not limited to the illustrated example. For example, the rigid fixing portion 600 and the floating fixing portions 700 may be arranged at locations at which noise is likely to occur on the substrate 300, and may be positively grounded. In this case, noise and heat generated on the substrate 300 can be released to the housing 200 and the cover 400 via the ground of the substrate 300 by the fixing screw 610 of the rigid fixing portion 600 and the stepped screws 710 of the floating fixing portions 700. Thus, the influence of noise and heat can be suppressed.

The specific configurations of the rigid fixing portion 600 and the floating fixing portion 700 are not limited to the illustrated examples. For example, although it has been described in the aforementioned embodiment that the boss 200a for the rigid fixing portion 600 and the boss 200b for the floating fixing portion 700 provided at the housing 200 have the same shape, the through-holes of the cover 400 and the substrate 300 into which the fixing screw 610 for the rigid fixing portion 600 is inserted have the small diameter, and the through-holes of the cover 400 and the substrate 300 into which the stepped screw 710 for the floating fixing portion 700 is inserted have the large diameter, the boss 200a for the rigid fixing portion 600 and the boss 200b for the floating fixing portion 700 may have different shapes, and the through-holes of the cover 400 and the substrate 300 into which the fixing screw 610 for the rigid fixing portion 600 is inserted and the through-holes of the cover 400 and the substrate 300 into which the stepped screw 710 for the floating fixing portion 700 is inserted may have the same diameters.

It has been described in the aforementioned embodiment that the elastic bodies 750 of the floating fixing portions 700 have the same characteristics. However, for example, the amount of deformation and the amount of sliding of the elastic body 750 of the floating fixing portion 700 provided at the position relatively far from a central point (in the present example, a point on the plane 160 on which the rigid fixing portion 600 is provided) between the optical axis 151R of the imaging unit 150R and the optical axis 151L of the imaging unit 150L may be greater than those of the elastic body 750 of the floating fixing portion 700 provided at the position relatively close to the central point in consideration of the difference in the amount of deformation and the amount of sliding of the cover 400 and the like caused by the distance separated from the rigid fixing portion 600 as the reference. In this case, hardness, material, surface friction, and shape of the elastic body 750, a compression rate (compressive force) of the elastic body 750, and the like are adjusted, and thus, it is possible to cope with the changes in the amount of deformation and the amount of sliding of the cover 400 and the like caused by the distance separated from the rigid fixing portion 600.

It has been described in the stereo camera device 100 of the present embodiment that the connector 330 is arranged on the left side of the rear portion of the substrate 300 and a force in the front-rear direction acts on the substrate 300 when the communication cable is inserted into or removed from the connector 330. However, the rigid fixing portion 600 is arranged at the center of the rear portion of the substrate mounting portion 210 and is arranged at the position near the connector 330, and the rigid fixing portion 600 and the floating fixing portion 700 are arranged in the left-right direction perpendicular to the front-rear direction. Thus, the force acting in the front-rear direction can be distributed and received, and the movement of the substrate 300 caused by such a force can be suppressed. Since the position of the substrate 300 is aligned by the rigid fixing portion 600, the rigid fixing portion 600 is arranged near the connector 330, and thus, the connector 330 can be necessarily arranged at the position facing the opening hole 270 of the substrate mounting portion 210. Accordingly, it is possible to provide components with high assembly accuracy and quality.

As described above, in the stereo camera device 100 of the present embodiment, the camera fixing portion 250 of the housing 200 to which the imaging units 150R and 150L are attached has the vertical cross-sectional shape of the L shape. For example, it is considered that the strength of the housing 200 may be lower than that of the flat box-shaped substrate mounting portion 210 at the central portion. Thus, when there is an attempt to fix the cover 400 at both the ends of the housing 200 outside the imaging units 150R and 150L in the longitudinal direction, the normal fixing using the fixing screw and the floating fixing using the elastic body are used, and thus, there is a possibility that the housing 200 is slightly deformed due to the warpage and distortion of the cover 400.

Thus, as described above, the hooking configuration 800 (see FIGS. 3 and 8) that includes the engagement holes 450*d* provided at the rising engagement surface portions 450*c* of the cover 400 and the engagement protrusion portions 250*d* provided at the reception recesses 250*e* of the housing 200 in order to prevent the cover 400 from being unlocked and perform the fixing so as not to freely vibrate during the vibration without rigidly fixing the housing 200 and the cover 400 (in other words, to a level at which it is possible to withstand the vibration (specifically, only the hooking configuration 800 is used for the fixing at both left and right sides of the imaging units 150R and 150L) is adopted as the fixing structure. Thus, when the outer peripheral wall portion 440 of the cover 400 is separated from the reception recess 250*e* of the housing 200 due to the vibration or the like, since the engagement hole 450*d* of the rising engagement surface portion 450*c* rides on the engagement protrusion portion 250*d* of the reception recess 250*e* and the force acting in the direction in which the engagement hole and the engagement protrusion portion are separated is divided into a force to ride on the engagement protrusion portion, it is possible to reduce the transmission of the force to the housing 200 from the cover 400 as possible. As a result, the deformation of the housing 200 caused by the warpage and distortion of the cover 400 is likely to occur, and it is possible to suppress the influence on the error in the optical axis or the like. Accordingly, it is possible to stabilize the measurement accuracy.

Although it has been described in the aforementioned embodiment that the stereo camera device 100 includes two imaging units, the present invention can be applied to a camera device including three or more imaging units. The distortion of the housing 200 is suppressed, and thus, it is possible to prevent a deviation between the optical axes and the setting change of the geometrical system with the vehicle. The shapes, forming materials, and the like of the housing 200, the substrate 300, the cover 400, and the like constituting the stereo camera device 100 are not limited to those in the aforementioned embodiment, and the present invention can be applied to a case where the linear expansion coefficients of the housing 200, the cover 400, and the substrate 300 are different.

While the embodiment of the present invention has been described in detail, the present invention is not limited to the aforementioned embodiment, and various changes in design may be made without departing from the spirit of the present invention described in the claims. For example, the aforementioned embodiment is described in detail in order to facilitate easy understanding of the present invention, and are not limited to necessarily include all the described components. Some of the components of a certain embodiment can be substituted into the components of another embodiment, and the components of another embodiment can be added to the component of a certain embodiment. In addition, the components of another embodiment can be added, removed, and substituted to, from, and into some of the components of the aforementioned embodiment.

REFERENCE SIGNS LIST 100 stereo camera device
150R, 150L imaging unit (first and second imaging units)
151R, 151L optical axis
160 plane
200 housing
200*a* boss (for rigid fixing portion)
200*b* boss (for floating fixing portion)
210 substrate mounting portion
210*a* inner surface portion
210*b* vertical wall portion
210*ba* front wall portion
210*bb* rear wall portion
210*bc* left side wall portion
210*bd* right side wall portion
210*c*, 210*d* notch portion
210*e* stepped surface
220 front vehicle body member fixing portion
230 side vehicle body member fixing portion
240 vehicle body member fixing portion
250 camera fixing portion
250*a* extension portion
250*b* vertical suspension front surface portion
250*c* vertical suspension side surface portion
250*d* engagement protrusion portion 250e reception recess
260 protrusion portion
270 opening hole
300 substrate
310 substrate body
310a small-diameter through-hole (for rigid fixing portion)
310b large-diameter through-hole (for floating fixing portion)
320 connection plate portion
330 connector
400 cover
410 substrate cover portion
410a small-diameter through-hole (for rigid fixing portion)
410b large-diameter through-hole (for floating fixing portion)
420 bottom surface portion
430 abutment surface portion
440 outer peripheral wall portion
450 camera cover portion
450a extension portion
450c rising engagement surface portion
450d engagement hole
500 signal cable
600 rigid fixing portion (first fixing portion)
610 fixing screw (first fixing member)
620 head
700 floating fixing portion (second fixing portion)
710 stepped screw (second fixing member)
711 screw shaft portion
712 thick shaft portion
713 flange portion
750 elastic body
800 hooking structure
1000 vehicle
1100 windshield

The invention claimed is:

1. A stereo camera device, comprising:
first and second imaging units;
a housing that includes the first and second imaging units;
a substrate that receives signals from the first and second imaging units, and has a linear expansion coefficient different from a linear expansion coefficient of the housing;
a cover that houses the substrate in cooperation with the housing, and has a linear expansion coefficient different from the linear expansion coefficient of the substrate;
a first fixing portion that co-fastens the substrate and the cover to the housing by a first fixing member without an elastic body interposed between the cover and the first fixing member; and
a second fixing portion that co-fastens the substrate and the cover to the housing by a second fixing member with an elastic body interposed between the cover and the second fixing member,
wherein the elastic body is configured to cause elastic deformation or sliding between the substrate and the cover so as to be allowable even though the cover holds a slight displacement from the substrate, and
the first fixing portion is provided at a position closer to a central point of a line segment connecting the first imaging unit and the second imaging unit than the second fixing portion.

2. The stereo camera device according to claim 1, wherein the first fixing portion and the second fixing portion are co-fastened such that the substrate is interposed between the housing and the cover.

3. The stereo camera device according to claim 2, wherein
a circumferential or annular vertical wall portion is erected along a peripheral edge of the housing,
a circumferential or annular abutment surface portion facing an upper surface of the vertical wall portion is provided along a peripheral edge of the cover, and a circumferential or annular outer peripheral wall portion is erected along a peripheral edge of the abutment surface portion, and
the cover houses the substrate in cooperation with the housing by mounting a peripheral edge of the substrate on the upper surface of the vertical wall portion, causing the abutment surface portion to abut on the peripheral edge of the substrate, and externally inserting the outer peripheral wall portion into the vertical wall portion.

4. The stereo camera device according to claim 1, wherein the first fixing portion is provided on a plane which passes through the central point and is perpendicular to the line segment.

5. The stereo camera device according to claim 1, wherein the second fixing portion is provided on the first imaging unit side and the second imaging unit side with a plane which passes through the central point and is perpendicular to the line segment interposed therebetween.

6. The stereo camera device according to claim 1, wherein the elastic body is made of rubber or resin having a function of allowing predetermined deformation and returning to a shape before deformation.

7. The stereo camera device according to claim 1, wherein
a plurality of the second fixing portions is provided, and
among the plurality of second fixing portions, an elastic body of the second fixing portion provided at a position relatively far from the central point is configured such that the amount of deformation or the amount of sliding is larger than the amount of deformation or the amount of sliding of an elastic body of the second fixing portion provided at a position relatively close to the central point.

8. The stereo camera device according to claim 1, wherein
the substrate is arranged between the first and second imaging units, rearward of the first and second imaging units, or at both the first and second imaging units, and
the housing and the cover are latched only by a hooking structure outside the first and second imaging units.

9. The stereo camera device according to claim 8, wherein the hooking structure includes an engagement protrusion portion provided at a side end of the housing, and an engagement hole which is provided at a side end of the cover and into which the engagement protrusion portion is fitted.

10. The stereo camera device according to claim 9, wherein
the engagement protrusion portion is provided in a reception recess portion provided at the side end of the housing, and
the engagement hole is bent at the side end of the cover and is erected, and is provided at a rising engagement surface portion fitted into the reception recess portion.

* * * * *